US008878511B2

(12) United States Patent
Iacob et al.

(10) Patent No.: US 8,878,511 B2
(45) Date of Patent: Nov. 4, 2014

(54) CURRENT-MODE PROGRAMMABLE REFERENCE CIRCUITS AND METHODS THEREFOR

(75) Inventors: Radu H. Iacob, Santa Clara, CA (US); Alexandra-Oana Petroianu, Bucharest (RO)

(73) Assignee: Semiconductor Components Industries, LLC, Phoenix, AZ (US)

( * ) Notice: Subject to any disclaimer, the term of this patent is extended or adjusted under 35 U.S.C. 154(b) by 656 days.

(21) Appl. No.: 12/700,290

(22) Filed: Feb. 4, 2010

(65) Prior Publication Data
US 2011/0187344 A1 Aug. 4, 2011

(51) Int. Cl.
*G05F 1/59* (2006.01)
*G05F 3/16* (2006.01)
*G05F 1/595* (2006.01)

(52) U.S. Cl.
CPC ....................................... *G05F 3/16* (2013.01)
USPC .......................................... 323/315; 323/313

(58) Field of Classification Search
USPC .................................................. 323/311–317
See application file for complete search history.

(56) References Cited

U.S. PATENT DOCUMENTS

| | | |
|---|---|---|
| 4,096,430 A | 6/1978 | Waldron |
| 4,127,783 A | 11/1978 | Alaspa |
| 4,158,804 A | 6/1979 | Butler et al. |
| 4,498,040 A | 2/1985 | Tatsushi et al. |
| 4,559,694 A | 12/1985 | Yoh et al. |
| 4,723,108 A | 2/1988 | Murphy et al. |
| 4,792,749 A | 12/1988 | Kitagawa |
| 4,812,681 A | 3/1989 | Pumphrey |
| 4,814,686 A | 3/1989 | Watanabe |
| 5,117,177 A | 5/1992 | Eaton, Jr. |
| 5,124,632 A | 6/1992 | Greaves |
| 5,315,230 A | 5/1994 | Cordoba et al. |
| 5,376,935 A | 12/1994 | Seligson |
| 5,394,359 A | 2/1995 | Kowalski |
| 5,493,141 A | 2/1996 | Ricco et al. |
| 5,563,760 A * | 10/1996 | Lowis et al. ................... 361/103 |
| 5,629,611 A * | 5/1997 | McIntyre ....................... 323/313 |
| 5,629,612 A | 5/1997 | Schaffer |
| 5,739,682 A | 4/1998 | Kay |
| 5,745,000 A | 4/1998 | Boerstler et al. |

(Continued)

FOREIGN PATENT DOCUMENTS

JP        2000172353        6/2000

OTHER PUBLICATIONS

Blauschild, R.A, Tucci, P.A., Muller, R.S., Meyer, R.G., A New NMOS Temperature-Stable Voltage Reference, IEEE Journal of Solid-State Circuits, vol. SC-13, No. 6, Dec. 1978.

(Continued)

*Primary Examiner* — Adolf Berhane
*Assistant Examiner* — Nusrat Quddus
(74) *Attorney, Agent, or Firm* — Polansky & Associates, P.L.L.C.; Paul J. Polansky

(57) ABSTRACT

A circuit includes a first current path comprising a first floating-gate transistor having a programmable threshold voltage, a second current path, and a differential amplifier. The second current path includes a second floating-gate transistor having a programmable threshold voltage and a resistor. The differential amplifier includes a first input coupled to the first current path, a second input coupled to the second current path, and an output configured to control a reference current path.

18 Claims, 6 Drawing Sheets

(56) References Cited

U.S. PATENT DOCUMENTS

| | | | |
|---|---|---|---|
| 5,873,053 A | 2/1999 | Pricer et al. | |
| 5,901,085 A | 5/1999 | Kramer et al. | |
| 5,910,914 A | 6/1999 | Wang | |
| 5,952,946 A | 9/1999 | Kramer et al. | |
| 5,990,816 A | 11/1999 | Kramer et al. | |
| 6,014,044 A | 1/2000 | Kramer et al. | |
| 6,091,286 A | 7/2000 | Blauschild | |
| 6,157,245 A | 12/2000 | Rincon-Mora | |
| 6,215,352 B1* | 4/2001 | Sudo | 327/530 |
| 6,222,470 B1 | 4/2001 | Schuelke | |
| 6,297,689 B1 | 10/2001 | Merrill | |
| 6,414,536 B1 | 7/2002 | Chao | |
| 6,441,680 B1 | 8/2002 | Leung et al. | |
| 6,448,844 B1 | 9/2002 | Cho | |
| 6,667,653 B2 | 12/2003 | Kronmueller et al. | |
| 6,737,909 B2* | 5/2004 | Jaussi et al. | 327/541 |
| 6,744,277 B1 | 6/2004 | Chang et al. | |
| 6,768,371 B1 | 7/2004 | Layton et al. | |
| 6,771,054 B2 | 8/2004 | Duval | |
| 6,798,278 B2 | 9/2004 | Ueda | |
| 6,882,582 B2 | 4/2005 | Sicard et al. | |
| 6,885,958 B2 | 4/2005 | Yaklin | |
| 6,914,831 B2 | 7/2005 | Di Iorio | |
| 6,919,753 B2 | 7/2005 | Wang et al. | |
| 6,930,538 B2* | 8/2005 | Chatal | 327/539 |
| 6,970,037 B2 | 11/2005 | Sakhuja et al. | |
| 7,034,603 B2 | 4/2006 | Brady et al. | |
| 7,038,530 B2 | 5/2006 | Chou | |
| 7,042,205 B2* | 5/2006 | Tseng et al. | 323/315 |
| 7,109,785 B2 | 9/2006 | Derksen | |
| 7,149,123 B2 | 12/2006 | Georgescu et al. | |
| 7,224,209 B2* | 5/2007 | Hsu | 327/538 |
| 7,245,536 B1 | 7/2007 | Poenaru et al. | |
| 7,288,985 B2 | 10/2007 | Serrano et al. | |
| 7,313,019 B2* | 12/2007 | Giduturi et al. | 365/185.03 |
| 7,372,316 B2 | 5/2008 | Chatterjee et al. | |
| 7,872,463 B2* | 1/2011 | Jongsma | 323/315 |
| 8,013,588 B2* | 9/2011 | Imura | 323/313 |
| 8,188,785 B2* | 5/2012 | Iacob et al. | 327/543 |
| 8,400,126 B2* | 3/2013 | Iacob et al. | 323/282 |
| 2001/0003507 A1* | 6/2001 | Maruyama et al. | 365/185.2 |
| 2001/0014035 A1 | 8/2001 | Briner | |
| 2002/0036488 A1 | 3/2002 | Ueda | |
| 2002/0060600 A1 | 5/2002 | Ueda | |
| 2003/0058694 A1 | 3/2003 | Marotta et al. | |
| 2003/0146785 A1 | 8/2003 | Ueda | |
| 2005/0046469 A1 | 3/2005 | Geissler | |
| 2005/0052223 A1 | 3/2005 | Sakhuja et al. | |
| 2007/0109876 A1 | 5/2007 | Umezawa | |
| 2007/0241809 A1 | 10/2007 | Kothandaraman et al. | |
| 2008/0048900 A1 | 2/2008 | Voicu et al. | |
| 2008/0150502 A1 | 6/2008 | Migliavacca | |
| 2008/0239825 A1 | 10/2008 | Yamada | |
| 2010/0156386 A1* | 6/2010 | Imura | 323/313 |
| 2010/0157672 A1* | 6/2010 | Barkley | 365/185.03 |
| 2011/0193544 A1* | 8/2011 | Iacob et al. | 323/315 |
| 2011/0248688 A1* | 10/2011 | Iacob et al. | 323/234 |
| 2011/0254521 A1* | 10/2011 | Iacob et al. | 323/282 |

OTHER PUBLICATIONS

Hirobumi Watanabe, Member, IEEE, Shunsuke Ando, Hideyuki Aota, Masanori Dainin, Yong-Jin Chun, and Kenji Taniguchi, Fellow, IEEE, CMOS Voltage Reference Based on Gate Work Function Differences in Poly-Si Controlled by Conductivity Type and Impurity Concentration, IEEE Journal of Solid-State Circuits, vol. 38, No. 6, Jun. 2003.

Actions on the Merits for co-pending U.S. Appl. No. 12/700,329, filed Feb. 4, 2010 and U.S. Appl. No. 12/703,842, filed Feb. 11, 2010.

IEEE STD 100-2000, 10.1109/IEEESTD.2000.322234, 2000, pp. 246-247.

Actions on the Merits for co-pending U.S. Appl. No. 12/700,329, filed Feb. 4, 2010, now issued U.S. Patent 8,188,785, issued May 29, 2012 and for copending U.S. Appl. No. 12/703,842, filed Feb. 11, 2010.

* cited by examiner

CURRENT-MODE PROGRAMMABLE REFERENCE CIRCUITS AND METHODS THEREFOR

CROSS-REFERENCE TO RELATED APPLICATIONS

This application is related to U.S. patent application Ser. No. 12/700,329 filed on Feb. 4, 2010, now U.S. Pat. No. 8,188,785, entitled "MIXED-MODE CIRCUITS AND METHODS OF PRODUCING A REFERENCE CURRENT AND A REFERENCE VOLTAGE." Further, this application is related to co-pending U.S. patent application Ser. No. 12/703,842 filed on Feb. 11, 2010, entitled "CIRCUITS AND METHODS OF PRODUCING A REFERENCE CURRENT OR VOLTAGE."

FIELD

The present disclosure is generally related to current-mode programmable reference circuits and methods therefor.

BACKGROUND

Programmable reference circuits have been developed and used in a variety of electronic devices. Such circuits can provide relatively stable reference voltages over a wide range of operating conditions. Amplifier circuitry and other circuits have been developed to enhance the accuracy of such reference voltages.

The most popular method for the implementation of voltage and current references is developed around the silicon energy bandgap. In such circuits, a reference current or voltage is derived from two p-n junctions operated at different current densities, each having a different forward bias voltage drop. Conventional circuits typically utilize voltage-mode architectures that require significant voltage head-room for reliable operation.

However, recent technological advances on deep sub-micron CMOS circuit implementation require reduced levels of operating voltages. Thus, voltage head-room has become increasingly limited, making it difficult to use conventional bandgap reference circuits. As a result, new reference architectures have been developed based on the current-mode approach.

BRIEF DESCRIPTION OF THE DRAWINGS

In the following description, the use of the same reference numerals in different drawings indicates similar or identical items.

DETAILED DESCRIPTION OF ILLUSTRATIVE EMBODIMENTS

Embodiments of a current-mode reference circuit are disclosed below that are based on programmable floating-gate transistors, which can be configured to provide an output current that can be adjusted (tuned or trimmed) with high accuracy. In some embodiments, the current-mode reference circuit includes two floating-gate transistors. The current-mode reference circuit also includes a differential amplifier configured to provide a difference of the threshold voltages of the floating-gate transistors across a reference resistor, producing a constant current. The difference of the programmable thresholds, which are reflected in the output reference current and reference voltage, is proportional to the difference of the electric charge that is present on the floating-gates of each of the programmable transistors. The ability to modify the amount of such electric charge on the floating gate provides a convenient mechanism to adjust the reference current and the reference voltage. The reference circuit can include an amplifier stage and/or a current mirror to generate a reference voltage based on the constant current.

Figure 1:
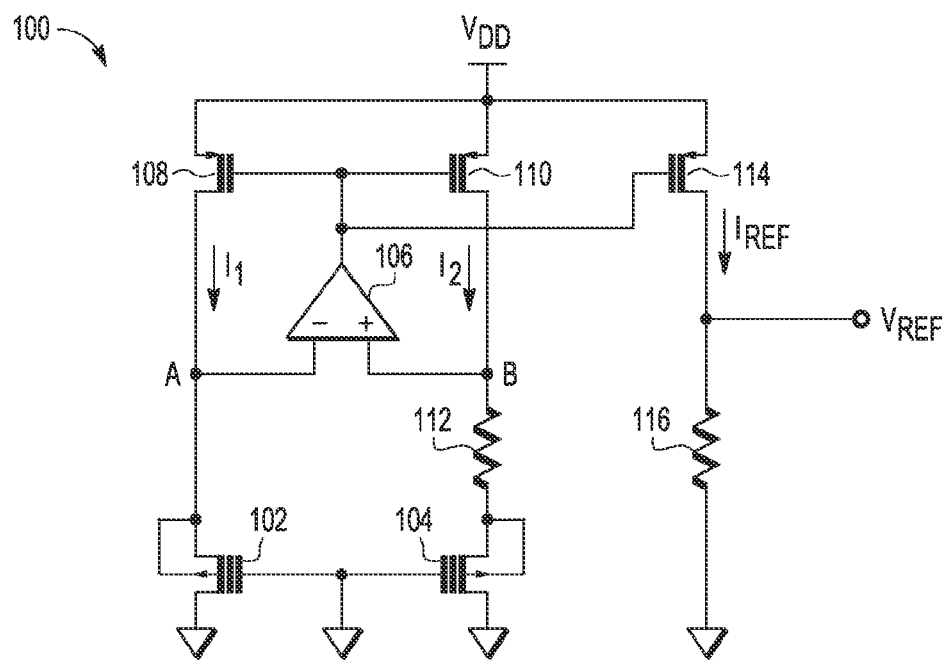
FIG. 1 is a schematic diagram of an embodiment of a current-mode programmable reference circuit using floating-gate PMOS transistors to produce a reference current.

FIG. 1 is a schematic diagram of an embodiment of a current mode programmable reference circuit 100 using floating-gate PMOS transistors 102 and 104 to produce a reference current. Circuit 100 includes floating-gate PMOS transistors 102 and 104, which are programmable floating-gate transistors having adjustable (programmable) threshold voltages. Circuit 100 further includes PMOS transistors 108, 110, and 114, and resistors 112 and 116. Additionally, circuit 100 includes a differential amplifier 106.

PMOS transistors 108, 110, and 114 are arranged in a common source, common gate configuration. PMOS transistor 108 includes a source electrode connected to a first power supply terminal, a gate electrode connected to an output of differential amplifier 106, and a drain electrode connected to a negative input of differential amplifier 106. PMOS transistor 110 includes a source electrode connected to the first power supply terminal, a gate electrode connected to the gate electrode of the PMOS transistor 108 and to the output of differential amplifier 106, and a drain electrode connected to a positive input of differential amplifier 106 and to a first terminal of resistor 112. The PMOS transistor 114 includes a source electrode connected to the first power supply terminal, a gate electrode connected to the gate electrodes of the PMOS transistors 108 and 110, and a drain electrode connected to a first terminal of resistor 116, which includes a second terminal connected to a second power supply terminal. In the illustrated embodiment, the second power supply terminal is ground. In an alternative embodiment, the second power supply terminal can be a power terminal that is another voltage negative relative to a supply voltage ($V_{DD}$) on the first power supply terminal.

PMOS transistor 102 includes a source electrode connected to the drain terminal of PMOS transistor 108 and to the negative input of differential amplifier 106, a gate electrode connected to the second power supply terminal, and a drain electrode connected to the second power supply terminal. PMOS transistor 104 includes a source electrode connected to a second terminal of resistor 112, a gate electrode connected to the gate electrode of PMOS transistor 102 and to the second power supply terminal, and a drain electrode connected to the second power supply terminal.

In the illustrated embodiment, the voltage ($V_{DD}$) on the first power supply terminal is a more-positive power supply voltage relative to the second power supply terminal. Circuit 100 is configured to operate within a range between 1.7V and 5.6V. In an embodiment, the voltage ($V_{DD}$) is nominally a 2.0V operating voltage. When the programmed threshold voltages are very low, circuit 100 can be operated at lower voltages, as low as 1.2V to 1.5V.

When power is applied to the first power supply terminal, the gate electrodes of PMOS transistors 108 and 110 have a voltage potential that is sufficiently negative relative to the voltage on the first power supply terminal to turn on PMOS transistors 108 and 110, allowing currents ($I_1$ and $I_2$) to flow through the respective source-to-drain current paths. If transistors 108 and 110 have approximately equal sizes, then the first current ($I_1$) is approximately equal to the second current ($I_2$). The second current ($I_2$) is sourced on resistor 112 to generate a voltage at node B. Differential amplifier 106 compares the voltage at node B to a voltage at node A and generates a control signal that is applied to the gate electrodes of transistors 108, 110, and 114.

Floating-gate transistors 102 and 104 are diode connected. As the voltage increases on the source electrode of transistor 102 to a level that is above the programmed threshold voltage, transistor 102 conducts current through its source-to-drain current path. Similarly, as the voltage increases at the source electrode of transistor 104 to a level that is above its programmed threshold voltage, transistor 104 conducts current through its source-to-drain current path. The second current ($I_2$) is established as the current that flows through resistor 112 sets the voltage at the positive input of differential amplifier 106, and the first current ($I_1$) sets the voltage at the negative input based on the source-to-drain voltage of transistor 102. As the currents flow through transistors 102 and 104, the voltages at nodes A and B change, causing the output of differential amplifier 106 to change, altering the voltage on gate electrodes 108, 110, and 114, thereby adjusting first and second currents ($I_1$ and $I_2$). After a period of time, the voltages at nodes A and B stabilize, and the first and second currents ($I_1$ and $I_2$) stabilize as well. PMOS transistor 114 is configured to mirror the second current ($I_2$) to produce the reference current ($I_{REF}$), which is sourced on resistor 116 to generate the reference voltage ($V_{REF}$).

In this embodiment, the floating gates of transistors 102 and 104 are programmed to adjust the voltage thresholds of transistors 102 and 104 and to fine tune (trim) the first current ($I_1$) and the second current ($I_2$) and thus the reference current ($I_{REF}$), which is proportional to the second current ($I_2$). In circuit 100, the floating gate of transistor 102 has a greater amount of positive electric charge (higher threshold voltage) than that of transistor 104.

Circuit 100 is configured to operate reliably to produce the reference current ($I_{REF}$) even at low voltages. Accordingly, circuit 100 can be used with low power supplies, such as a 2.0 volt power supply.

Figure 2:
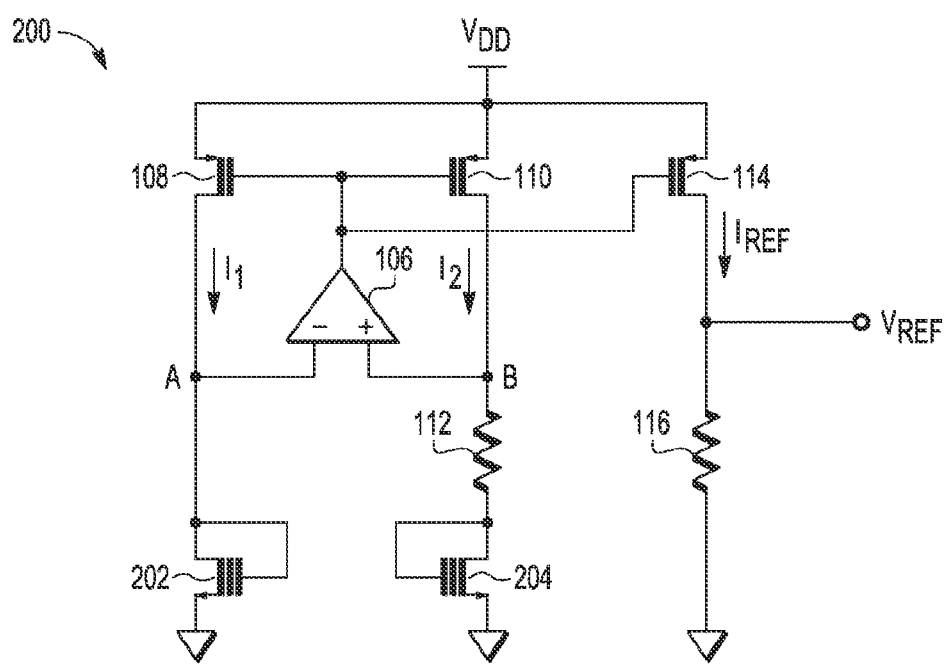
FIG. 2 is a schematic diagram of a second embodiment of a current-mode programmable reference circuit using floating-gate NMOS transistors to produce a reference current.

FIG. 2 is a schematic diagram of a second embodiment of a current mode programmable reference circuit 200 using floating-gate NMOS transistors 202 and 204 to produce a reference current. Floating-gate NMOS transistors 202 and 204 have programmable threshold voltages, which can be configured using programming circuitry, such as that depicted in FIGS. 4-6 below. NMOS transistor 204 can be programmed to have a lower threshold voltage than NMOS transistor 202, allowing NMOS transistor 202 to sink the same amount of current at a greater gate-to-source voltage as NMOS transistor 204. In this embodiment, NMOS transistor 202 includes a drain electrode connected to the drain electrode of PMOS transistor 108, a gate electrode connected to the drain electrode and to the negative input of differential amplifier 106, and a source electrode connected to the second power supply terminal. NMOS transistor 204 includes a drain electrode connected to the second terminal of resistor 112, a gate electrode connected to the drain electrode in a diode configuration, and a source electrode connected to the second power supply terminal.

In the illustrated embodiment, the voltage ($V_{DD}$) on the first power supply terminal is a more-positive power supply voltage relative to the second power supply terminal, with a nominal value of 2.0 volts with respect to ground. When power is applied to the first power supply terminal, the gate electrodes of PMOS transistors 108 and 110 have a voltage potential that is sufficiently negative relative to the voltage on the first power supply terminal to turn on PMOS transistors 108 and 110, allowing currents ($I_1$ and $I_2$) to flow through the respective source-to-drain current paths. If transistors 108 and 110 have approximately equal sizes, then the first current ($I_1$) is approximately equal to the second current ($I_2$). The second current ($I_2$) is sourced on resistor 112 to generate a voltage at node B. Differential amplifier 106 compares the voltage at node B to a voltage at node A and generates a control signal that is applied to the gate electrodes of transistors 108, 110, and 114.

Floating-gate transistors 202 and 204 are diode connected. As the voltage increases on the source electrode of transistor 202 to a level that is above the programmed threshold voltage, transistor 202 conducts current through its drain-to-source current path. Similarly, as the voltage increases at the source electrode of transistor 204 to a level that is above its programmed threshold voltage, transistor 204 conducts current through its drain-to-source current path. The second current ($I_2$) is established as the current that flows through resistor 112 to set the voltage at the positive input of differential amplifier 106, and the first current ($I_1$) sets the voltage at the negative input based on the source-to-drain voltage of transistor 202. As the currents flow through transistors 202 and 204, the voltages at nodes A and B change, causing the output of differential amplifier 106 to change, altering the voltage on gate electrodes 108, 110, and 114, thereby adjusting first and second currents ($I_1$ and $I_2$). After a period of time, the voltages at nodes A and B stabilize, and the first and second currents ($I_1$ and $I_2$) stabilize as well. PMOS transistor 114 is configured to mirror the second current ($I_2$) at the output current path to produce the reference current ($I_{REF}$), which is sourced on resistor 116 to generate the reference voltage ($V_{REF}$).

In this embodiment, the floating gates of transistors 202 and 204 can be programmed to adjust the threshold voltages of transistors 202 and 204 and to fine tune (trim) the first current ($I_1$) and the second current ($I_2$). Further, such programming of the floating gates can be used to adjust the reference current ($I_{REF}$), which is proportional to the second current ($I_2$). In operation, the difference in gate-to-source voltages between NMOS transistors 202 and 204 is applied across resistor 112 to set currents $I_1$ and $I_2$ and to generate a control signal at the output of differential amplifier 106. The control signal controls current flow through PMOS transistors 108 and 110 and controls current flow within the output current path, which includes PMOS transistor 114, to produce the reference current ($I_{REF}$) that can be sourced on resistor 116 to provide a reference voltage ($V_{REF}$).

Figure 3:
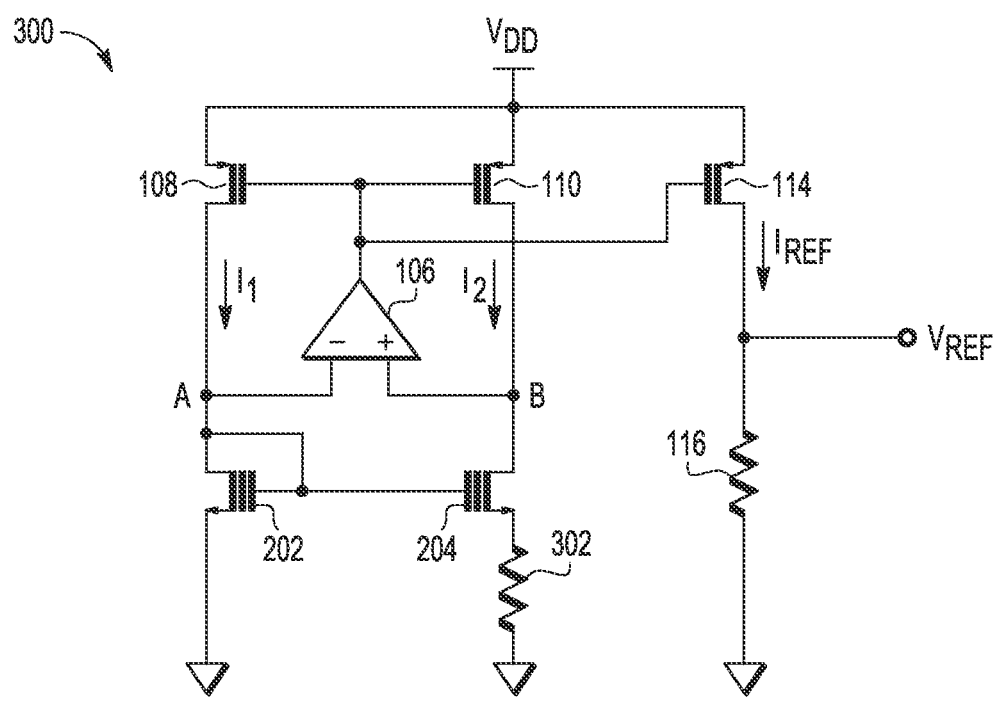
FIG. 3 is a schematic diagram of a third embodiment of a current-mode programmable reference circuit using floating-gate NMOS transistors to produce a reference current.

FIG. 3 is a schematic diagram of a third embodiment of a current-mode programmable reference circuit 300 using floating-gate NMOS transistors 202 and 204 to produce a reference current. In this embodiment, resistor 112 is omitted such that the drain electrode of NMOS transistor 204 is connected to the drain electrode of PMOS transistor 110 and to the positive input of differential amplifier 106. Further, the gate electrode of NMOS transistor 204 is connected to the gate electrode of NMOS transistor 202. The source electrode of NMOS transistor 204 is connected to a first terminal of resistor 302, which has a second terminal connected to the second power supply terminal.

In this embodiment, NMOS transistors 202 and 204 function as both threshold references and gain devices. Initially when power is applied to the first power supply terminal, the gate electrodes of PMOS transistors 108 and 110 are sufficiently biased negative relative to the power supply terminal to allow first current ($I_1$) and second current ($I_2$) to flow through their respective source-to-drain current paths. NMOS transistors 202 and 204 are conductive due to the diode configuration of NMOS transistor 202. The resistor 302 establishes a voltage differential between the voltage at the drain electrode of transistor 202 relative to the voltage at the drain electrode of transistor 204. The difference in gate-to-source voltages between NMOS transistors 202 and 204 is applied across resistor 302 to establish currents $I_1$, $I_2$, and $I_{REF}$. Differential amplifier 106 generates a control signal to control current flow through PMOS transistors 108 and 110 to adjust the first current ($I_1$) and the second current ($I_2$) until the voltages at nodes A and B stabilize. PMOS transistor 114 mirrors the second current ($I_2$) to produce the reference current ($I_{REF}$), which is proportional to the second current ($I_2$) and which can be sourced on resistor 116 to provide the reference voltage ($V_{REF}$).

Figure 4:
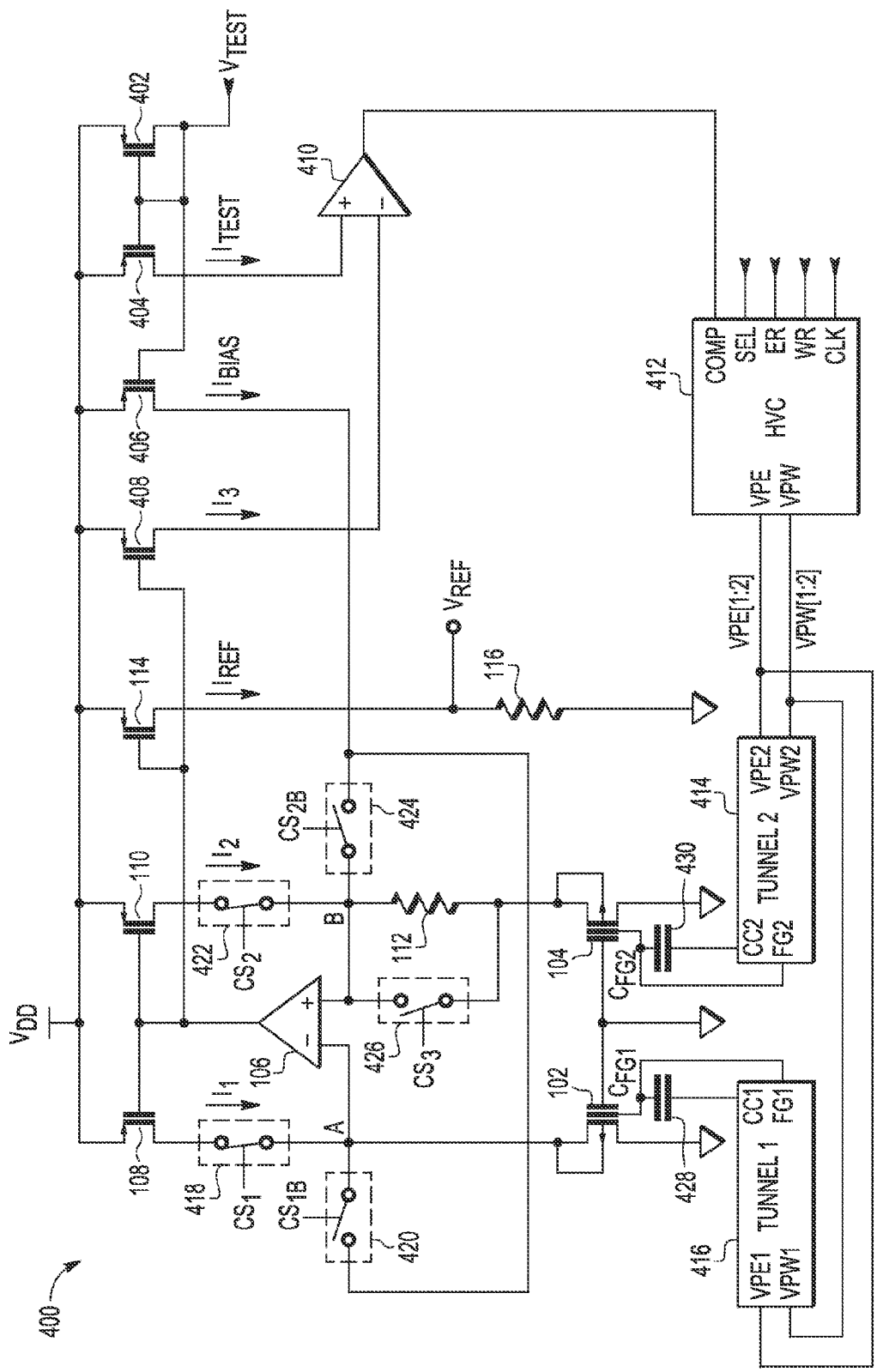
FIG. 4 illustrates in partial block diagram and partial schematic form an embodiment of a circuit including an embodiment of a current mode programmable reference circuit and associated programming circuitry.

FIG. 4 illustrates in partial block diagram and partial schematic form an embodiment of a circuit 400 including a current mode programmable reference circuit, such as circuit 100 depicted in FIG. 1, and associated programming circuitry. Circuit 400 includes programmable floating-gate PMOS transistors 102 and 104, PMOS transistors 108, 110, and 114, resistors 112 and 116, and differential amplifier 106. Circuit 400 further includes PMOS transistors 402, 404, 406, and 408, and differential amplifier 410. Additionally, circuit 400 includes programming circuitry, such as a high voltage controller 412, floating gate programming tunnels 414 and 416, and switches 418, 420, 422, 424, and 426, which can be independently controlled by high voltage controller 412 to program the threshold voltages (depicted as capacitors 428 and 430) associated with PMOS transistors 102 and 104. Floating gate programming tunnels 414 and 416 represent conceptual circuitry accessible to high voltage circuit 412 to program the floating gate charge on transistors 102 and 104. In circuit 400, the programming tunnels 414 and 416 are MOS diodes that share their polysilicon gate with the floating-gate of the MOS transistors 102 and 104. The floating-gates of transistors 102 and 104 are programmed through the gate polysilicon layer of the MOS diodes.

PMOS transistor 402 includes a source electrode connected to the power supply terminal, a gate electrode connected to a voltage test electrode ($V_{TEST}$), and a drain electrode connected to the gate electrode and to the voltage test electrode ($V_{TEST}$). PMOS transistor 404 includes a source electrode connected to the power supply terminal, a gate electrode connected to the gate electrode of PMOS transistor 402 and to the voltage test electrode ($V_{TEST}$), and a drain electrode connected to a positive input of differential amplifier 410. PMOS transistor 406 includes a source electrode connected to the power supply terminal, a gate electrode connected to the gate electrodes of PMOS transistors 402 and 404 and to the voltage test electrode ($V_{TEST}$), and a drain electrode. PMOS transistor 408 includes a source electrode connected to the power supply terminal, a gate electrode connected to the output of differential amplifier 106 and to the gate electrodes of PMOS transistors 108, 110, and 114, and a drain electrode connected to a negative input of current comparator 410.

Current comparator 410 includes an output connected to a control input of high voltage controller 412. A select signal at the SEL input of high voltage controller 412 selects which of the PMOS transistors 102 or 104 to be programmed. An erase signal or a write signal received at the ER and WR inputs of high voltage controller 412 determines which high-voltage programming cycle the circuit 400 is undergoing. A clock signal received at the CLK input of high voltage controller 412 drives a high-voltage generator, which is implemented with a charge-pump circuit. Switches 418, 420, 422, and 424 are used for separate programming of each PMOS transistor 102 or 104, relative to the other PMOS transistor.

High voltage controller 412 is coupled to PMOS transistors 102 and 104 through floating gate programming tunnel devices 414 and 416 to program their respective floating-gates. The programmed floating-gate charges of transistors 102 and 104 are represented by capacitors 430 and 428, respectively.

In a read mode, the high voltage controller 412 employs PMOS transistors 102 and 104, resistor 112, differential amplifier 106, and PMOS transistors (current mirrors) 108, 110, and 114. Differential amplifier 106 is either biased from a separate current source, self-biased, or biased by the current reference itself. In an embodiment, the read mode is the default operating mode, when the circuit 400 is providing a constant current and voltage across a wide range of environmental conditions. Due to its ability to program the current ($I_2$) at various levels, the reference can be operated in strong inversion, in weak inversion or in the transition region between the weak and strong inversion, sometimes called moderate inversion. In general, the reference current ($I_{REF}$) is approximately equal to the second current ($I_2$), which is related to a difference in threshold voltages between the PMOS transistors 102 and 104.

In a programming mode, high voltage controller 412 uses additional components for sourcing the external current ($I_{TEST}$) to be programmed. The PMOS transistors 102 and 104 are erased and written through the floating-gate tunnel devices 416 and 414, respectively, which are controlled by the high-voltage controller 412. The accuracy of the reference current ($I_{REF}$) can be adjusted using the feedback provided by current comparator 410, which evaluates the output current ($I_3$) on the drain electrode of PMOS transistor 408 with respect to a target ($I_{TEST}$) current on the drain terminal of PMOS transistor 404. High voltage controller 412 is configured to selectively activate switches 418, 420, 422, 424 for biasing either PMOS transistor 102 or PMOS transistor 104 from a bias current ($I_{BIAS}$) that mirrors the target ($I_{TEST}$) current to provide a reference for programming the other PMOS transistor. The switch 426 is optional and implements an alternative programming reference for PMOS transistor 102, by connecting PMOS transistor 104 directly to the positive input of differential amplifier 106, while receiving the bias current ($I_{BIAS}$).

In an alternative embodiment, the PMOS transistor 104 connected to the positive input of differential amplifier 106 can be programmed, while the floating-gate PMOS transistor 102 on the negative input of differential amplifier 106 is used as a reference to program the threshold voltage of PMOS transistor 104. In another embodiment, as shown in FIG. 5, the floating gate programming scheme can be further developed with the inclusion of a third floating-gate device, which can be used as reference for programming PMOS transistors 102 and 104.

In an embodiment, programming involves two high voltage cycles. The first high voltage cycle erases the selected PMOS transistor 102 or 104, bringing the selected PMOS transistor into a default state that allows further trimming to the final state of high-precision adjustment. The second high-voltage cycle, regarded as the write cycle, performs a fine-tuning of the selected PMOS transistor 102 or 104, until a target bias condition is achieved with a desired precision. Considering a trimming procedure that involves first the programming of PMOS transistor 102, PMOS transistor 104 has the function of a reference device, biased by the external test current ($I_{TEST}$) through resistor 112. The erase operation involving PMOS transistor 102 makes it fully conductive, bringing its threshold voltage to negative values. PMOS transistor 102 can then be operated in the linear region, tolerating high drain currents. At this point, the goal of the write procedure is to change the potential of the floating gate in a controlled manner to achieve a well-determined current through PMOS transistor 102 biased in saturation. As a result, the source potential of PMOS transistor 102 will be higher than the source potential of PMOS transistor 104, by a voltage difference determined by the reference current flowing through resistor 112. Subsequently, PMOS transistor 104 can be programmed, using PMOS transistor 102 as a reference device biased using the test current ($I_{TEST}$) through the switch 420, which is turned on by high voltage controller 412 during this stage, while the switch 418 is turned off.

Figure 5:
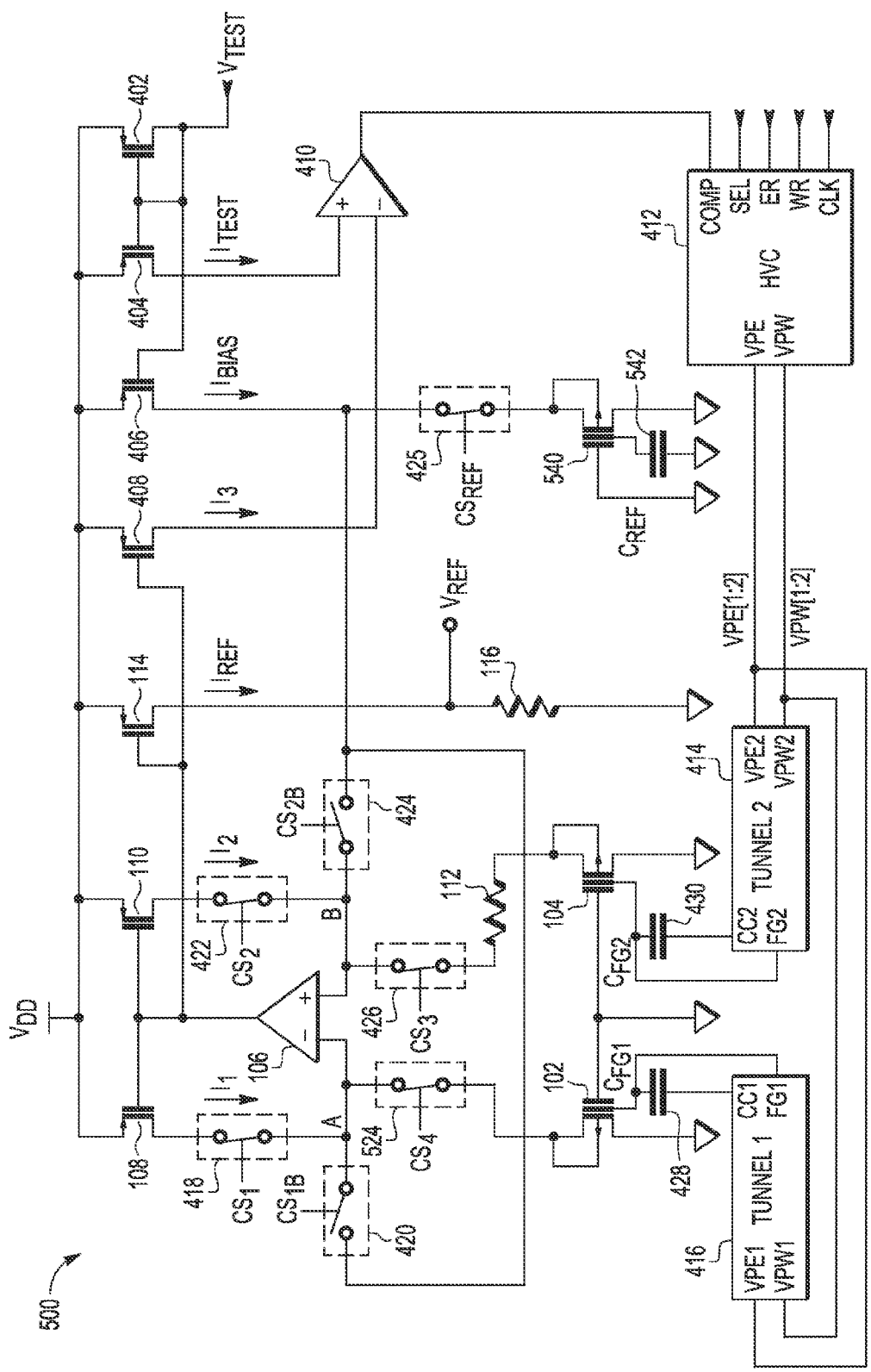
FIG. 5 illustrates in partial block diagram and partial schematic form a second embodiment of a circuit including the circuit depicted in FIG. 4 and including a programmable floating-gate reference transistor.

FIG. 5 illustrates in partial block diagram and partial schematic form a second embodiment of a circuit 500 including the circuit 400 depicted in FIG. 4 and including a programmable floating-gate reference transistor 540. The PMOS transistor 540 has a programmable threshold voltage, represented by capacitor 542. PMOS transistor 540 includes a source electrode connected to the drain terminal of PMOS transistor 406 and to positive and negative inputs of differential amplifier 106 through switches 424 and 420, respectively. PMOS transistor 540 further includes a gate electrode connected to the second power supply terminal and a drain electrode connected to the second power supply terminal.

In an example, during a programming mode, one of the PMOS transistors 102 and 104 is programmed while the other acts as a trimming reference, relative to the native threshold value of the PMOS transistor 540. To adjust PMOS transistor 102, for example, high voltage controller 412 selectively controls switch 422, switch 425 and switch 424 to bias resistor 112 and PMOS transistor 104 using the bias current ($I_{BIAS}$) and the test current ($I_{TEST}$). In particular, high voltage controller 412 turns switch 422 off, switch 425 off and turns switch 424 on. The resulting current ($I_3$) on the drain electrode of PMOS transistor 408 mirrors the reference current ($I_{REF}$) on the drain electrode of PMOS transistor 114, which is compared with the test current ($I_{TEST}$) by differential amplifier 410, which sends a feedback signal to a comparator input of the high-voltage controller 412. High voltage controller 412 controls floating gate programming tunnels 414 and 416, which are conceptual programming paths for programming the floating gates of transistors 102 and 104.

A select signal at the SEL input of high voltage controller 412 selects which of the PMOS transistors 102 or 104 to be programmed. An erase signal or a write signal received at the ER and WR inputs of high voltage controller 412 determines which high-voltage programming cycle the circuit 400 is undergoing. A clock signal received at the CLK input of high voltage controller 412 drives a high-voltage generator, which is implemented with a charge-pump circuit.

Switches 418, 420, 422, and 424 are used for separate programming of each PMOS transistor 102 or 104, relative to the other PMOS transistor. When programming is intended with respect to PMOS transistor 540, switches 426, 524, 424, 420 and 425 are activated in order to disconnect the complementary pair PMOS device (either PMOS transistor 102 or 104) and to connect PMOS transistor 540 instead. PMOS transistor 540 can be a programmable floating-gate transistor or another type of device, as required by the implementation of the trimming procedure. The PMOS transistor 540 can be used as a third reference to program each of the PMOS transistors 102 and 104.

Figure 6:
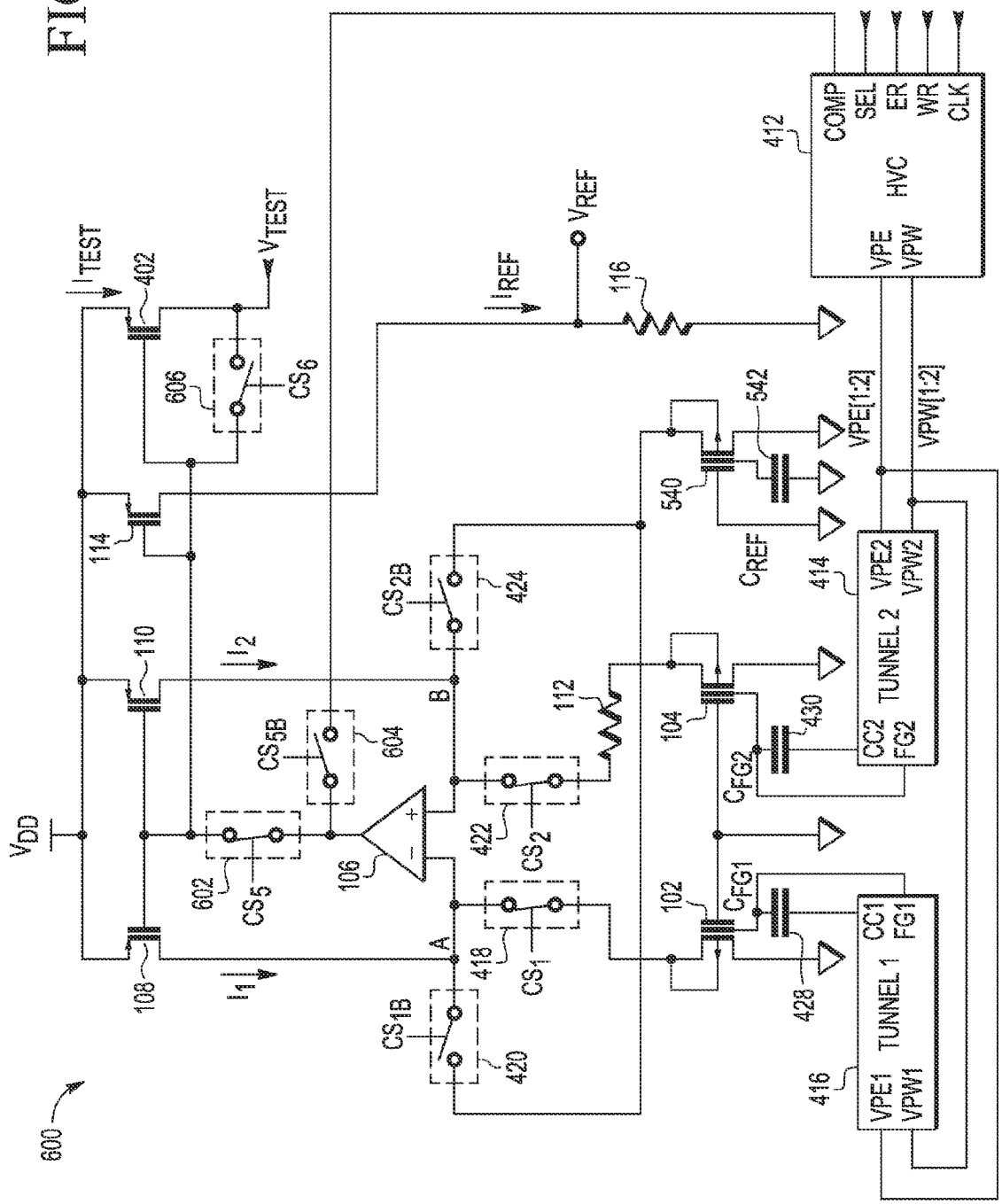
FIG. 6 illustrates in partial block diagram and partial schematic form a third embodiment of a circuit including an embodiment of a current mode programmable reference circuit and associated programming circuitry.

FIG. 6 illustrates in partial block diagram and partial schematic form a third embodiment of a circuit 600 including the circuit 500 depicted in FIG. 5. The circuit 600 is the same as the circuit 500 in FIG. 5, except that current comparator 410 is omitted and the output of differential amplifier 106 is used as a comparator to provide the programming feedback signal to the high voltage controller 412. The output signal from differential amplifier 106 is appropriately interpreted in conjunction with the tunnel device selection signal SEL at high voltage controller 412.

High voltage controller 412 biases the circuit 600 by selectively turning off switch 602 and turning on switches 604 and 606 while the test current ($I_{TEST}$) is being applied. Differential amplifier 106 compares the voltage levels of node A and node B, and terminates the adjustment process when both nodes have equal potentials. The adjusted current produces a reference current ($T_{REF}$) that is equal to the test current ($I_{TEST}$), once the programming procedure has ended and the device is operated in read mode.

In FIG. 6, the currents ($I_1$) and ($I_2$) are mirrored copies of the test current ($I_{TEST}$) during the adjustment (trimming) procedure. In an embodiment, high voltage controller 412 controls switches 418, 420, 422, and 424 only when the programming of PMOS transistors 102 and 104 is performed with respect to PMOS transistor 540.

One feature of the programming technique implemented for the current-mode architectures of FIGS. 1 and 4-6 is the continuous adjustment (trimming) until the target parameter is achieved, without requiring multiple write pulses such as in program-verify algorithms. The circuit makes it possible for the high voltage controller 412 to operate the tunnel devices 414 and 416 in such a way that the bias parameters of the selected PMOS transistor 102 or 104 are not disturbed, except for those bias parameters that are strictly related to the variation of electric charge on the floating gate of the selected PMOS transistor that is the subject of precision trimming. At the same time, the circuit offers the possibility of reversing the programming sequence to first apply the write cycle, which increases the threshold voltage of the selected PMOS transistor, and then gradually decrease the threshold voltage through a controlled erase procedure. However, such a sequence may use a pulsed high voltage erase cycle followed by an evaluation stage, within an iterative process that stops when the desired reference current value is achieved.

It should be understood that, though the above-examples in FIGS. 1 and 4-6 show PMOS transistors, the functional and trimming considerations described above can be applied to other programmable architectures, such as NMOS floating-gate transistors, such as those depicted in FIGS. 2 and 3. In such a case, the programming procedure can be modified appropriately, since the threshold voltage adjustment of NMOS floating-gate transistors uses opposite polarities of the high voltage signals as compared to the PMOS floating-gate transistors.

Figure 7:
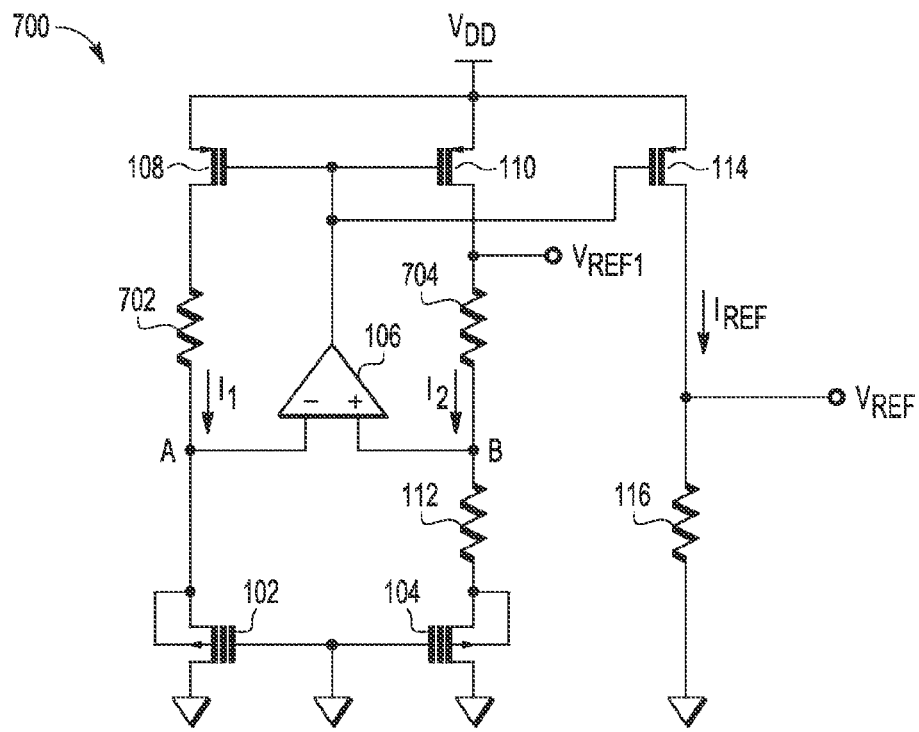
FIG. 7 is a schematic diagram of a fourth embodiment of a current mode programmable reference circuit to produce a reference current.

FIG. 7 is a schematic diagram of a fourth embodiment of a current mode programmable reference circuit 700 to produce a reference current. Circuit 700 represents a modified version of circuit 100, depicted in FIG. 1, in order to implement a mixed-mode reference. Circuit 700 includes resistors 702 and 704. Resistor 702 has a first terminal connected to the drain electrode of PMOS transistor 108 and a second terminal connected to the negative input of differential amplifier 106 and to the source electrode of PMOS transistor 102. Resistor 704 has a first terminal connected to the drain electrode of PMOS transistor 110 to produce a second reference voltage ($V_{REF1}$) based on the second current ($I_2$). Resistor 704 also includes a second terminal connected to the positive input of differential amplifier 106 and to a first terminal of resistor 112.

Figure 8:
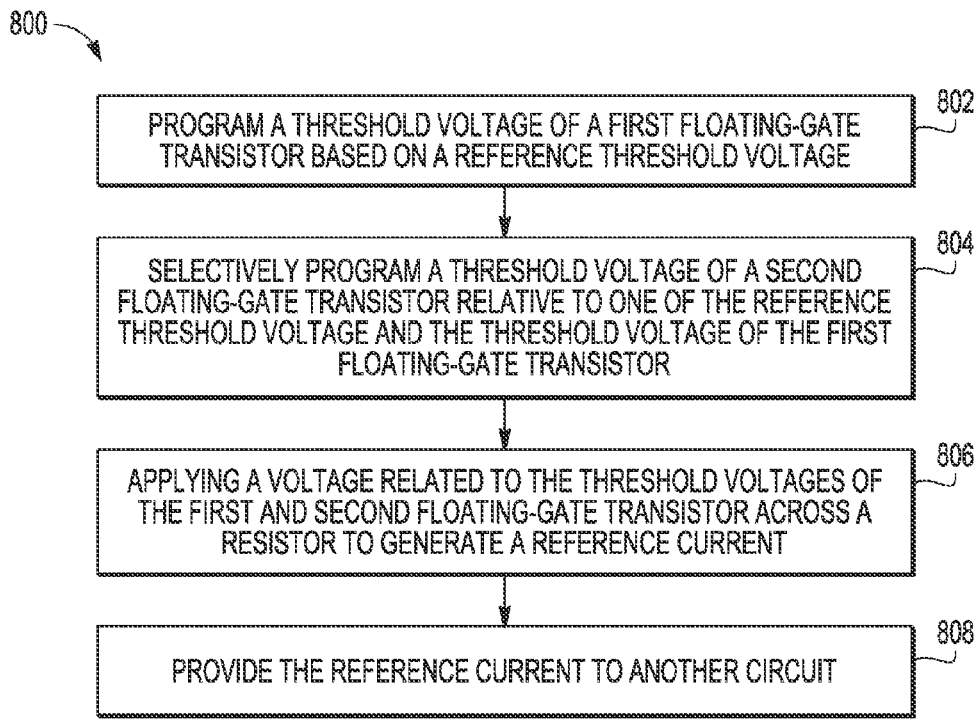
FIG. 8 depicts a flow diagram of a method for providing a reference current using a current mode programmable reference circuit.

In this example, when the currents ($I_1$ and $I_2$) through PMOS transistors 104 and 102 are in a ratio of variable (p) to 1 (p:1) or when the size of PMOS transistor 104 is a multiple (p) of PMOS transistor 102, the resulting reference current ($I_{REF}$) mirrors the second current ($I_2$) and has a proportional to absolute temperature (PTAT) component and a zero temperature coefficient (ZTC) component, presuming that the PMOS transistors 102 and 104 are operated in a sub-threshold mode. In such an instance, a principle similar to a band gap reference can be used to generate the second reference voltage ($V_{REF1}$). In this example, adding resistor 704 to the drain electrode of PMOS transistor 110 and resistor 702 for symmetry on the drain electrode of PMOS transistor 108, the second reference voltage ($V_{REF1}$) can be collected at the first terminal of resistor 704. Neglecting variation due to temperature of the capacitors, the temperature coefficient (TC) of the second reference voltage ($V_{REF1}$) is predominantly determined by the ratios of the resistors and transistors FIG. 8 depicts a flow diagram of a method 800 of providing a reference current using a current mode programmable reference circuit. At 802, a threshold voltage of a first floating-gate transistor is programmed. In an embodiment, the threshold voltage of the first floating-gate transistor is programmed based on a reference threshold voltage.

Moving to 804, a threshold voltage of a second floating-gate transistor is selectively programmed. In an embodiment, the threshold voltage of the second floating-gate transistor is programmed relative to one of a reference threshold voltage of a reference transistor and the threshold voltage of the first floating-gate transistor.

Advancing to 806, a voltage related to the threshold voltages of the first and second floating-gate transistors is applied across a resistor to generate a reference current. Proceeding to 808, the reference current is provided to another circuit. In an embodiment, the method terminates after 808. In another embodiment, the method is performed periodically, continuously, or during a configuration process. In method 800, blocks 802 and 804 are completed during a programming (or configuration) operation to configure the floating gates of the transistors. Further, blocks 806 and 808 are performed during operation, after configuration, to generate the reference current.

In a particular embodiment, the threshold voltage of the first floating-gate transistor is programmed by activating a switch to couple a pre-determined bias current to the reference transistor, activating a switch to decouple the resistor and the second floating-gate transistor from the second input of the differential amplifier, and activating a switch to couple the programming reference transistor to the second input of the differential amplifier. Further, the method can include generating a programming reference based on the pre-determined bias current and controlling a tunneling structure using a high voltage circuit to program the threshold voltage of the first floating-gate transistor based on the programming reference. In a further embodiment, the tunneling structure is controlled by receiving the programming reference current at a first input of an amplifier, receiving a test current at a second input of the amplifier, and comparing the programming reference current to the test current using the amplifier to produce the programming control signal.

In another particular embodiment, the threshold voltage of the second floating-gate transistor is selectively programmed by activating a switch to decouple the first floating-gate transistor from its original bias, activating a switch to couple a pre-determined bias current to the first floating-gate transistor, generating a programming reference based on the pre-determined bias current, and controlling a tunneling structure using a high voltage circuit to program the threshold voltage of the second floating-gate transistor based on the programming reference.

In another embodiment, the threshold voltage of the second floating-gate transistor is programmed by activating a switch to decouple the first floating-gate transistor from the first input of the differential amplifier, activating a switch to couple a reference transistor biased by a pre-determined current and having a reference threshold to the first input of the differential amplifier, and generating a programming reference based on the pre-determined bias current. Further, a tunneling structure is controlled using a high voltage circuit to program the threshold voltage of the second floating-gate transistor based on the programming reference.

In conjunction with the circuits and methods described above with respect to FIGS. 1-7, a current-mode reference architecture (or a mixed-mode reference architecture) is disclosed that can be operated at low voltages. The circuits include programmable floating-gate transistors, which are not included within the gain stages of the differential amplifier 106, making it possible to operate the circuits under a wide range of current values, including operation in deep sub-threshold. A difference between source-to-gate voltages between the programmable MOS transistors is applied across a resistor to generate a control signal to control an output current path, which carries the reference current. Further, the circuits can be implemented using NMOS or PMOS transistors.

Although the present invention has been described with reference to preferred embodiments, workers skilled in the art will recognize that changes may be made in form and detail without departing from the scope of the invention.

What is claimed is:
1. A circuit comprising:
   a first current path comprising a first floating-gate transistor having a programmable threshold voltage, said first floating-gate transistor being diode-connected;
   a second current path comprising:
      a second floating-gate transistor having a programmable threshold voltage, said second floating-gate transistor being diode-connected; and
      a resistor;

a differential amplifier including a first input coupled to the first current path, a second input coupled to the second current path, and an output configured to control a reference current path;
a power supply terminal;
a first transistor including a first terminal coupled to the power supply terminal, a second terminal coupled to the first current path, and a gate terminal coupled to the output of the differential amplifier; and
a second transistor including a source terminal coupled to the power supply terminal, a drain terminal coupled to the second current path, and a gate terminal coupled to the output of the differential amplifier,
wherein the first and second transistors have approximately equal sizes, and the programmable threshold voltage of the first floating-gate transistor is higher than the programmable threshold voltage of the second floating-gate transistor.

2. The circuit of claim 1, wherein:
the first transistor comprises a first p-channel transistor including a source terminal coupled to the power supply terminal, a drain terminal coupled to the first current path, and a gate terminal coupled to the output of the differential amplifier; and
the second transistor comprises a second p-channel transistor including a source terminal coupled to the power supply terminal, a drain terminal coupled to the second current path, and a gate terminal coupled to the output of the differential amplifier.

3. The circuit of claim 2, wherein:
the reference current path comprises:
a third p-channel transistor including a source terminal coupled to the power supply terminal, a drain terminal to carry a reference current, and a gate terminal coupled to the output of the differential amplifier; and
a reference resistor including a first terminal coupled to the drain of the third p-channel transistor.

4. The circuit of claim 1, further comprising a reference transistor having a reference threshold.

5. The circuit of claim 4, further comprising a programming circuit to program the first and second floating-gate transistors relative to the threshold of the reference transistor.

6. The circuit of claim 4, further comprising a programming circuit to configure the first floating-gate transistor relative to the threshold of the reference transistor.

7. A circuit comprising:
a current mirror comprising a plurality of transistors including an output transistor to provide a reference current;
an amplifier circuit including an output configured to control current flow through the current mirror, and including first and second inputs;
a resistor including a first terminal coupled to the second input, and including a second terminal;
a first floating-gate transistor including a drain terminal coupled to the first input, a gate terminal coupled to the first input of the amplifier circuit, and programmable to define a first threshold voltage; and
a second floating-gate transistor including a drain terminal coupled to the second terminal of the resistor, a gate terminal coupled to the gate terminal of the first floating-gate transistor, and programmable to define a second threshold voltage,
wherein the first and second floating-gate transistors comprise n-channel transistors.

8. The circuit of claim 7, wherein the plurality of transistors comprises:

a first p-channel transistor including a source terminal coupled to a power supply terminal, a gate terminal coupled to the output of the amplifier circuit, and a drain terminal coupled to the first input of the amplifier circuit;
a second p-channel transistor including a source terminal coupled to the power supply terminal, a gate terminal coupled to the output of the amplifier circuit, and a drain terminal coupled to the second input of the amplifier circuit; and
the output transistor including a source terminal coupled to the power supply terminal, a gate terminal coupled to the output of the amplifier circuit, and a drain terminal to provide the reference current.

9. The circuit of claim 8, further comprising a second resistor including a first terminal coupled to the drain terminal of the second p-channel transistor and including a second terminal coupled to the second input of the amplifier circuit.

10. The circuit of claim 7, wherein the first and second floating-gate transistors comprise p-channel transistors, and wherein the first terminals of the first and second floating-gate transistors comprise source terminals.

11. The circuit of claim 10, wherein drain and gate terminals of the first and second floating-gate transistors are coupled to ground.

12. A method of providing a reference current, the method comprising:
programming a threshold voltage of a first floating-gate transistor;
selectively programming a threshold voltage of a second floating-gate transistor; and
applying a voltage related to the threshold voltages of the first and second floating-gate transistors across a resistor to generate the reference current,
wherein programming the threshold voltage of the first floating-gate transistor comprises:
activating a first switch to couple a pre-determined bias current to a reference transistor;
activating a second switch to decouple the resistor and the second floating-gate transistor from a second input of a differential amplifier;
activating a third switch to couple the reference transistor to the second input of the differential amplifier;
generating a programming reference based on the pre-determined bias current; and
controlling a tunneling structure using a high voltage circuit to program the threshold voltage of the first floating-gate transistor based on the programming reference.

13. The method of claim 12, further comprising providing the reference current to another circuit.

14. The method of claim 12, wherein programming the threshold voltage of the first floating-gate transistor comprises programming the threshold voltage based on a reference threshold voltage.

15. The method of claim 12, wherein selectively programming the threshold voltage of the second floating-gate transistor comprises selectively programming the threshold voltage relative to one of a reference threshold voltage of a reference transistor and the threshold voltage of the first floating-gate transistor.

16. The method of claim 12, wherein controlling the tunneling structure comprises:
receiving the programming reference current at a first input of an amplifier;
receiving a test current at a second input of the amplifier; and comparing the programming reference current to the test current using the amplifier to produce the programming control signal.

17. The method of claim 12, wherein selectively programming the threshold voltage of the second floating-gate transistor comprises:
   activating a first switch to decouple the first floating-gate transistor from its original bias;
   activating a second switch to couple a pre-determined bias current to the first floating-gate transistor;
   generating a programming reference based on the pre-determined bias current; and
   controlling a tunneling structure using a high voltage circuit to program the threshold voltage of the second floating-gate transistor based on the programming reference.

18. The method of claim 12, wherein selectively programming the threshold voltage of the second floating-gate transistor comprises:
   activating a first switch to decouple the first floating-gate transistor from a first input of a differential amplifier;
   activating a second switch to couple a reference transistor biased by a pre-determined current and having a reference threshold to the first input of the differential amplifier;
   generating a programming reference based on the pre-determined current; and
   controlling a tunneling structure using a high voltage circuit to program the threshold voltage of the second floating-gate transistor based on the programming reference.

* * * * *

UNITED STATES PATENT AND TRADEMARK OFFICE
CERTIFICATE OF CORRECTION

PATENT NO. : 8,878,511 B2
APPLICATION NO. : 12/700290
DATED : November 4, 2014
INVENTOR(S) : Radu H. Iacob et al.

It is certified that error appears in the above-identified patent and that said Letters Patent is hereby corrected as shown below:

In the Specification:

In column 8, line 37, replace "($T_{REF}$)" with "($I_{REF}$)".

Signed and Sealed this
Tenth Day of November, 2015

Michelle K. Lee
*Director of the United States Patent and Trademark Office*